US010626013B2

(12) United States Patent
Traub

(10) Patent No.: US 10,626,013 B2
(45) Date of Patent: Apr. 21, 2020

(54) ANTI-WETTING COATING FOR SI-BASED MEMS FLUIDIC DEVICE, AND METHOD OF APPLICATION OF SAME

(71) Applicant: CANON KABUSHIKI KAISHA, Tokyo (JP)

(72) Inventor: Matthew C. Traub, Austin, TX (US)

(73) Assignee: Canon Kabushiki Kaisha, Tokyo ( * ) Notice: Subject to any disclaimer, the term of this patent is extended or adjusted under 35 U.S.C. 154(b) by 0 days.

(21) Appl. No.: 15/945,595

(22) Filed: Apr. 4, 2018

(65) Prior Publication Data
US 2019/0308875 A1 Oct. 10, 2019

(51) Int. Cl.
*B81C 1/00* (2006.01)
*B81B 3/00* (2006.01)
*G03F 7/00* (2006.01)

(52) U.S. Cl.
CPC ........ *B81C 1/00373* (2013.01); *B81B 3/0089* (2013.01); *G03F 7/0002* (2013.01); *B81B 2201/057* (2013.01); *B81C 2201/016* (2013.01); *B81C 2201/0133* (2013.01); *B81C 2201/0188* (2013.01)

(58) Field of Classification Search
CPC ............ B81C 1/00349; B81C 1/00373; C23C 16/0227; C23C 16/48; C23C 16/482; C23C 16/483
USPC .................................................. 427/553, 558
See application file for complete search history.

(56) References Cited

U.S. PATENT DOCUMENTS

| 4,939,065 A | * | 7/1990 | Cavezzan | ................ C08K 5/23 430/154 |
| 6,841,079 B2 | * | 1/2005 | Dunbar | ................ B81B 3/0005 216/11 |
| 8,277,024 B2 | * | 10/2012 | McAvoy | ................ B41J 2/1404 347/45 |
| 8,765,359 B2 | | 7/2014 | Fernandez et al. | |
| 2010/0018948 A1 | * | 1/2010 | Sim | ........................ B41J 2/1606 216/27 |

OTHER PUBLICATIONS

Jillian Buriak, Illuminating Silicon Surface Hydrosilation: An Unexpected Plurality of Mechanisms, Chemistry of Materials, 2014, 26, pp. 763-772, ACS Publications, Washington, DC, US.
Franz Effenberger, et al., Photoactivated Preparation and Patterning of Self-Assembled Monolayers with 1-Alkenes and Aldehydes on Silicon Hydride Surfaces, Angewandte Chemie International Edition in English, 1998, pp. 2462-2464, 37, No. 18, Wiley-VCH Verlag GmbH & Co.

(Continued)

*Primary Examiner* — Michael P Wieczorek
(74) *Attorney, Agent, or Firm* — Canon U.S.A.Inc., IP Division

(57) ABSTRACT

A photo-patterned fluorocarbon monolayer directly grafted to Si surface atoms provides anti-wetting performance at controlled locations, wherein the Si surface oxide is etched and reacted with fluorocarbon chains with a terminal C—C double bond, resulting in Si—C surface. As the direct Si—C linkages are chemically robust, and much more resistant to decomposition than Si—O—C bonds, the resulting surface does not suffer from the shortcomings of current MEMS dispensers.

8 Claims, 2 Drawing Sheets

(56) References Cited

OTHER PUBLICATIONS

Dokyoung Kim, et al., Thermally Induced Silane Dehydrocoupling on Silicon Nanostructures, Angewandte Chemie International Edition in English, Apr. 21, 2016, pp. 6423-6427, 55, Wiley-VCH Verlag GmbH & Co.

Simone Ciampi, et al., The Rapid Formation of Functional Monolayers on Silicon Under Mild Conditions, Phys. Chem. Chem Phys., Royal Society of Chemistry, Mar. 10, 2014, pp. 8003-8011, 16, The Owner Societies.

Raluca Voicu, et al., Formation, Characterization, and Chemistry of Undecanoic Acid-Terminated Silicon Surfaces: Patterning and Immobilization of DNA, Langmuir, Nov. 18, 2004, pp. 11713-11720, 20, American Chemical Society.

William J. I. Debenedetti, Half-flat vs. Atomically Flat: Alkyl Monolayers on Morphologically Controlled Si(100) and Si(111) Have Very Similar Structure, Density, and Chemical Stability, The Journal of Chemical Physics, 052804, Sep. 29, 2016, pp. 052804-1-052804-7, 146, American Institute of Physics.

Arun Kumar Gnanappaa, et al., Improved Aging Performance of Vapor Phase Deposited Hydrophobic Self-assembled Monolayers, Applied Surface Science, Dec. 17, 2010, pp. 4331-4338, 257, Elsevier B.V.

\* cited by examiner

ANTI-WETTING COATING FOR SI-BASED MEMS FLUIDIC DEVICE, AND METHOD OF APPLICATION OF SAME

FIELD OF THE DISCLOSURE

The present disclosure relates generally to apparatus and methods for preparing and applying an anti-wetting coating to a micro-electromechanical system (hereafter "MEMS") dispenser for use in semiconductor applications.

BACKGROUND OF THE DISCLOSURE

Imprint lithography has been used to fabricate semiconductor devices as well as for electrical, optical, photonic and biological applications.

Specific to the present disclosure, Si-based MEMS dispensers represent a potential advancement to existing imprint lithography and other processes, as they may be adapted to dispense higher dot-per-inch ("dpi") resist drop patterns which may in turn improve process throughput and reduce defects. However, resists for semiconductor applications are often designed to spread quickly over Si substrates. This arrangement creates potential defect issues for Si-based MEMS dispensers, as the resist can also spread across the surface of the printhead and form a continuous film. If this film grows thick and/or quickly enough, it can lead to imprint resist leaking onto the substrate, thus compromising the entire substrate and devices formed thereon. Furthermore, a build-up of such fluid layers on the printhead surface can compromise nozzle performance leading to drop volume and placement inaccuracy, which in turn leads to imprint patterning defects, or even to nozzles being blocked, causing non-fill pattern defects. While blotting the fluid film may be one way of correcting the defect, it may further lead to additional compromises, including the introduction of unacceptable levels of particle contamination.

In addition, typical anti-wetting coatings deteriorate rapidly when exposed to the environment, leading to diminished surface contact angles, which in turn make the coatings unsuitable for microfluid application. Although hydrolysis has been held to blame for the rapid deterioration, other factors may be contributing and/or enabling the hydrolysis.

One approach to limiting these defect issues includes applying a hydrophobic anti-wetting coating to the printhead faceplate, thus lessening fluid spreading and build-up.

Various methods for applying an anti-wetting layer for Si surfaces exist; however, these methods do not translate well for MEMS applications in e.g. imprint lithography, leaving breaches in the technology, including a need for a more stable, longer lasting anti-wetting coating.

Accordingly, it would be particularly beneficial to disclose apparatus and methods for preparing and applying an anti-wetting coating to a MEMS device without existing detriments.

SUMMARY

Thus, to address such exemplary needs, the presently disclosed apparatus and methods for preparing and applying an anti-wetting coating, for use in MEMS, is provided.

The present disclosure teaches various methods for coating a silicon based MEMS dispenser with an anti-wetting layer, as well as the apparatus and process for using the MEMS dispenser. In various embodiments the method for coating a surface of a silicon substrate found on the MEMS dispenser comprises removing an oxide layer from the surface of the silicon substrate to expose a bare silicon surface. The bare silicon surface is treated with radiation to initiate a reaction with a compound comprising a fluorinated alkyl chain having a terminal alkene, which chemically forms a stable silicon-carbon bond on the surface of the silicon substrate of the MEMS dispenser.

The present disclosure further teaches a microelectromechanical system fluid dispenser having a silicon substrate, coated by a process, wherein the process comprises removing an oxide layer from a surface of the silicon substrate, followed by treating the exposed silicon substrate with radiation to react the surface of the silicon substrate with a compound comprising a fluorinated alkyl chain having a terminal alkene, thus forming a silicon-carbon bond. Wherein the radiation could be UV light, electromagnetic radiation, thermal radiation, infrared ("IR"), derivatives thereof, and combination therefrom.

The preset subject matter also discloses a silicon based microelectromechanical system fluid dispenser comprising a silicon surface coated with a compound having a fluorinated alkyl chain, wherein the compound is covalently bonded to the silicon surface by a silicon-carbon bond.

The microelectromechanical system fluid dispenser boasts a coated surface has a contact angle of 90 degrees or greater. In some variants, the contact angle remains at 90 degrees or greater after the dispenser has been exposed to water for thirty days.

In other embodiments the contact angle of the microelectromechanical system fluid dispenser remains at 90 degrees or greater after the dispenser has been exposed to water for one-hundred-eighty days.

In various embodiments, removing the oxide layer from the silicon substrate may include treating the silicon substrate with a hydrogen fluoride compound.

In various other embodiments, the subject method for coating the surface of the silicon substrate may employ a photomask positioned between the silicon substrate and the radiation source to target a section of the silicon substrate to be treated. By way of example, sensitive areas on the surface of the silicon substrate may be masked by the photomask, such that the anti-wetting coating is not applied.

In yet additional embodiments, reacting the surface of the silicon substrate with a compound comprising a fluorinated alkyl chain having a terminal alkene to form a Si—C bond may be accelerated by adding a sacrificial electron acceptor.

In other embodiments, the compound comprising a fluorinated alkyl chain may be a fluorinated alkene with a chain length varying from 6-12 carbons.

In various other embodiments, the degree of reaction of the surface of the silicon substrate with the fluorinated alkene and/or the degree of fluorination of the fluorinated alkene may be controlled to further improve stability and adjust contact angle.

In additional embodiments, the degree of fluorination may be controlled to control stability and contact angle. That is, stability and contact angle control can be accomplished through (i) degree of reaction, i.e., how many reactive sites on the Si substrate are actually reacted with the fluorinated alkene—for example, a branched fluoro alkene will create more steric hindrance to reactive sites as compared to an unbranched fluoro alkene—and/or (ii) the degree of fluorination of the fluoro alkene itself—for example, perfluorinated versus less than perfluorinated.

These and other objects, features, and advantages of the present disclosure will become apparent upon reading the following detailed description of exemplary embodiments of the present disclosure, when taken in conjunction with the appended drawings, and provided paragraphs.

BRIEF DESCRIPTION OF THE DRAWINGS

Further objects, features and advantages of the present invention will become apparent from the following detailed description when taken in conjunction with the accompanying figures showing illustrative embodiments of the present invention.

Figure 1:
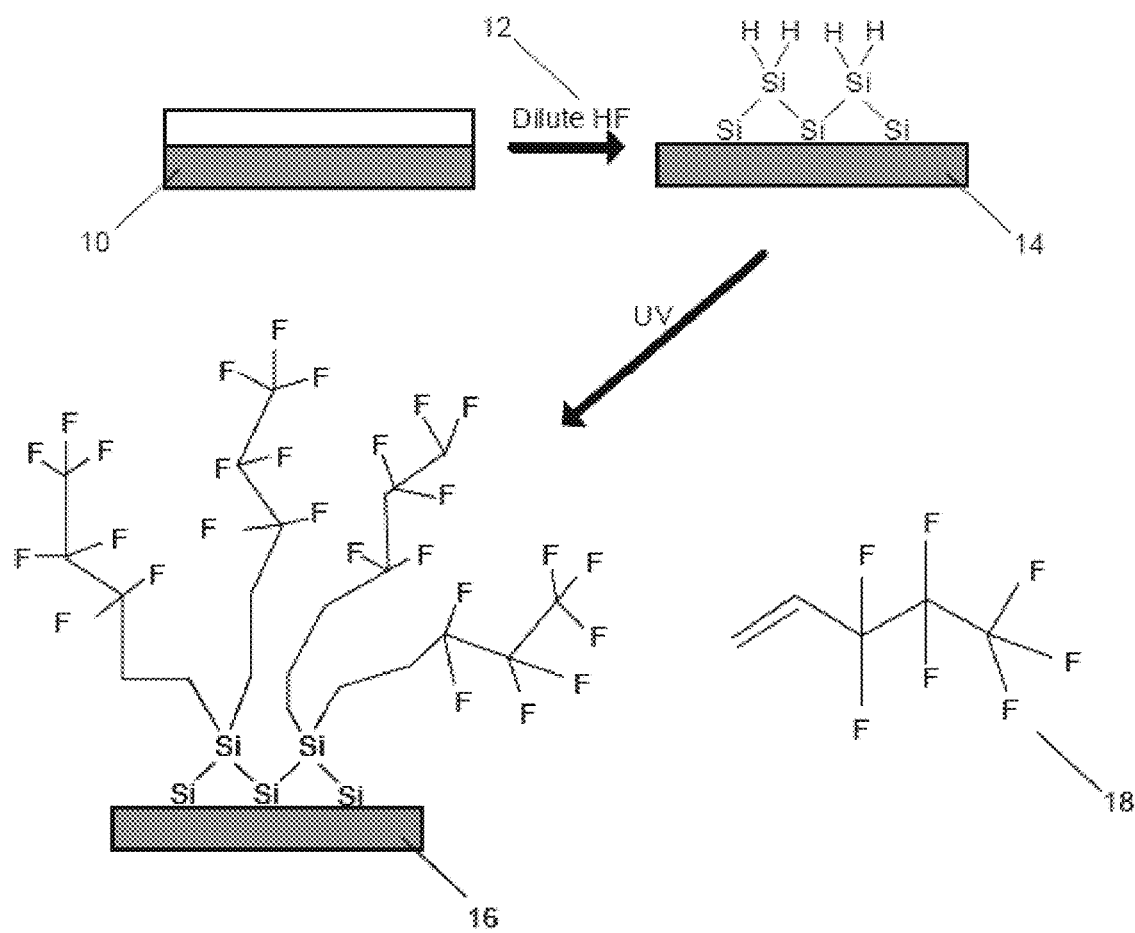
FIG. 1 provides an illustration of one or more chemical reaction steps associated with one or more embodiments of the present subject matter.

Throughout the Figures, the same reference numerals and characters, unless otherwise stated, are used to denote like features, elements, components or portions of the illustrated embodiments. Moreover, while the subject invention will now be described in detail with reference to the Figures, it is done so in connection with the illustrative embodiments. It is intended that changes and modifications can be made to the described embodiments without departing from the true scope and spirit of the subject disclosure as defined by the appended paragraphs.

DETAILED DESCRIPTION OF THE DISCLOSURE

The present disclosure incorporates the understanding that Si—C carbon linkages are far more chemically robust than other linkages, such as Si—O—Si linkages, to develop an anti-wetting surface.

Various methods disclosed herein provide an effective, stable, and long-lasting coating which would be advantageous in the art, and help prevent particulation if the film degrades by having the coating be covalently bonded to the surface of the faceplate, not physisorbed. In the case of a Si device, this represents bonding between a Si surface and some other chemical species. Other advantages include having more stable covalent bonds which provide hydrolytic stability, thus reducing break-down over the life of the dispenser. Further advantages of the present disclosure include a coating which is chemically compatible with the resist, and capable of selective application to the faceplate, without making the immediate nozzle area, or especially the interior of the nozzle, anti-wetting, thus eliminating poor contact between the fluid and the nozzle or channel walls which can significantly degrade jetting performance.

FIG. 1 provides one or more chemical reaction steps associated with one or more embodiments of the present subject matter. This chemical reaction is performed by introducing the Si surface oxide chip 10 to dilute hydrogen fluoride 12 ("HF") or buffered $NH_4F$ for etching the chip 10, resulting in a Si—H terminated surface 14. The Si—H terminated surface 14 is reacted with fluorocarbon chains having a terminal C—C double bond, in the presence of radiation (e.g. UV light), resulting in the Si—C bonded chip 16. This reaction in the presence of UV light is one example for treating the surface of the silicon substrate so as to prevent degradation during use as well as subsequent processing steps, should they be necessary. Although the treatment step may be performed at room temperature, the process may be accelerated by elevated temperatures. The treatment may further occur in ambient air or in a vacuum.

FIG. 1 also depicts the optional use of a sacrificial electron acceptor 18, which may be utilized to accelerate the fluorinated alkyl chain having a terminal alkene to form a Si—C bond.

Figure 2A:
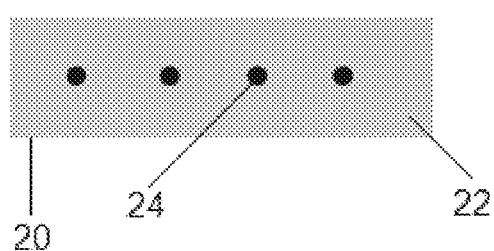
FIG. 2a illustrates a top perspective image of the inkjet chip surface, according to one or more embodiments of the present subject matter.

As provided in FIG. 2a, an inkjet chip 20 having a bare single crystal Si surface 22 can be chemically etched (using dilute HF, buffered oxide etch, or $NH_4F$) to remove the native oxide layer on the surface 22, leaving the surface 22 terminated by Si—H bonds. The nozzles 24 are for ink (fluid) distribution, applicable in a MEMS dispenser.

The surface 22 is chemically stable against reoxidation for tens of minutes, thus providing sufficient time to chemically modify the surface 22 without using any special precautions against ambient air. Organic molecules with terminal C═C double bonds are introduced to react with Si—H light under radiation, thus stabilizing the surface of the silicon substrate. In various embodiments this reaction may be accelerated with the use of a sacrificial electron acceptor. Forms of radiation which may be used include, but are not limited to: ultraviolet ("UV") light; electromagnetic radiation, such as radio waves, microwaves, visible light, x-rays, and gamma radiation; thermal radiation; infrared ("IR"); derivatives thereof; and combination therefrom.

Figure 2B:
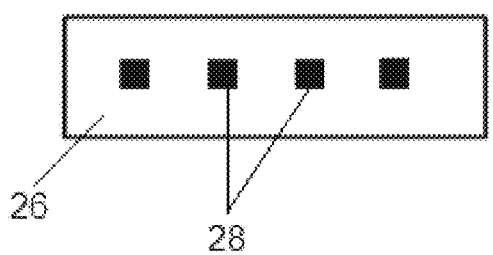
FIG. 2b illustrates a top perspective image of the photomask surface, according to one or more embodiments of the present subject matter.

As provided in FIG. 2b, a photomask 26 may be used for patterning with a collimated radiation source, or a focused radiation source, and a scanning substrate stage to selectively control which areas of the surface are irradiated, and subsequently reacted. In this embodiment, the photomask 26 is configured to not radiate the areas 28 around the nozzles 24. By using functional groups with, for example, a C═C bond on one end of a hydrocarbon chain and a carboxylic acid group on the other end, it is possible to create selective binding sites on the surface 22. Functional groups have also been used as a method to electrically passivate Si surfaces and reduce carrier recombination due to surface trap states at the Si/SiO2 interface.

Alternatively, a sufficiently focused radiation source can be used without a photomask, thus allowing for focused illumination treatment of the surface wherein the radiation source may be maneuvered such that the areas 28 are not exposed, thus allowing for targeted treatment of the surface 22.

By using a fluorocarbon with a terminal alkene group, a highly anti-wetting layer can be attached to the Si surface by means of Si—C linkages. The use of shorter alkyl chains, which are less sterically constrained, allows for faster reaction times, allowing more surface sites to be covered, whereas longer chains provide a higher percentage of perfluoro groups. Optimization of the length of the alkyl chain results in chain lengths of 6-12 (e.g., perfluorohexane is one such compound. This optimal chain length ensures better coverage of the alkyl monolayer on the surface.

Photopatterning, via the photomask 26, will prevent the anti-wetting coating from affecting the immediate nozzle 24 area, allowing optimized jetting while preventing excess fluid from accumulating on the faceplate and causing defects. In various embodiments, the degree of fluorination on the surface groups can be controlled during synthesis, by allowing a spacer between fluorinated groups and the Si—C linkage to further improve stability or further adjust the contact angle. (A "spacer" is defined as an additional 1 carbon spacer (—$CH_2$—) which may be optimal for added stability while still having adequate fluorination for anti-wetting properties—E.g. C=C—$CH_2$—$CF_2$—$CF_2$—$CF_3$ is one such compound).

In addition, degree of fluorination on the surface groups can be further controlled by adjusting the degree of reaction, i.e., how many reactive sites on the Si substrate are actually reacted with the fluorinated alkene. For example, a branched fluoro alkene will create more steric hindrance to reactive sites as compared to an unbranched fluoro alkene, resulting in relatively less fluorine coverage across the same area. Similarly, in the case of UV activated reaction, a lower UV dosage will lower the amount of reaction taking place and thus lower fluorine coverage.

Figure 2C:
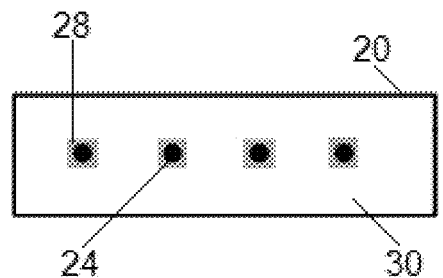
FIG. 2c illustrates a top perspective image of the functionalized inkjet chip surface, according to one or more embodiments of the present subject matter.

FIG. 2c provides one embodiment of a functionalized inkjet chip 20 depicting the effects of the photopatterning on the Si surface 22 using the photomask 26. As depicted, the nozzles 24, and areas 28 around the nozzles, are not coated by the anti-wetting coating 30, thus keeping the Si surface bare around the nozzles 24.

Figure 2D:
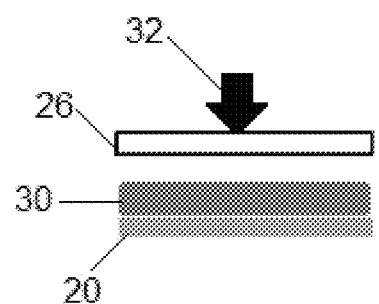
FIG. 2d provides a side perspective image of the functionalized inkjet chip surface, according to one or more embodiments of the present subject matter.

FIG. 2d provides a side perspective view of one embodiment of a functionalized inkjet chip 20 depicting the effects of the photopatterning on the Si surface 22 using the photomask 26. As depicted, the photomask 26 is positioned between the chip surface 22 having the anti-wetting coating 30, and the UV light source 32, thus exposing only the desired portions of the anti-wetting coating 30 to the UV light source 32.

One of the aspects of the subject disclosure is to provide an anti-wetting coating capable of maintaining a high contact angles (i.e., 90 degrees or greater) after extended exposure of the coating to the environment (e.g. air and/or water). The anti-wetting coating provides for maximized surface coverage, thereby limiting water molecules from reaching the surface, and further forms linkages having a kinetically stable Si—C bonds that are resistant to hydrolysis.

Contact angle may be measured using any number of methods known in the art. In the present disclosure static contact angle measurements can be performed on the coatings by the sessile drop method using deionized water and a contact angle instrument (goniometer), with an average angle calculated in an effort to minimize error. Contact angles greater than 90 degrees can be observed after exposure to water for up to 30 days, up to 90 days, and up to 180 days or more.

The invention claimed is:

1. A method for coating a silicon substrate on a microelectromechanical system fluid dispenser including one or more nozzles, the method comprising:
   removing an oxide layer from a surface of the silicon substrate, the surface of the silicon substrate including an area around the one or more nozzles; and
   treating a portion of the surface of the silicon substrate with radiation to react the portion of the surface of the silicon substrate with C=C—$CH_2$—$CF_2$—$CF_2$—$CF_3$,
   wherein the area of the surface of the silicon substrate around the one or more nozzles is not treated with the radiation.

2. The method of claim 1, wherein the removing the oxide layer includes treating the silicon substrate with a hydrogen fluoride compound.

3. The method of claim 1, wherein the radiation is selected from the group consisting of UV light, electromagnetic radiation, thermal radiation, infrared ("IR"), derivatives thereof, and combination therefrom.

4. The method of claim 3, further comprising positioning a photomask between the surface of the silicon substrate and the radiation such that the portion of the surface of the silicon substrate is treated with the radiation and the area of the surface of the silicon substrate around the one or more nozzles is not treated with the radiation.

5. The method of claim 3, further comprising adding a sacrificial electron acceptor to accelerate the reacting the portion of the surface of the silicon substrate with the C=C—$CH_2$—$CF_2$—$CF_2$—$CF_3$.

6. The method of claim 1, further comprising controlling a degree of reaction of the portion of the surface of the silicon substrate with the C=C—$CH_2$—$CF_2$—$CF_2$—$CF_3$.

7. The method of claim 1, wherein the radiation is UV light.

8. The method of claim 1, wherein the one or more nozzles comprises a plurality of nozzles.

* * * * *